US011277143B1

(12) United States Patent
Kundu et al.

(10) Patent No.: US 11,277,143 B1
(45) Date of Patent: Mar. 15, 2022

(54) REFERENCE SAMPLING TYPE-I FRACTIONAL-N PHASE LOCKED LOOP

(71) Applicant: Intel Corporation, Santa Clara, CA (US)

(72) Inventors: Somnath Kundu, Hillsboro, OR (US); Abhishek Agrawal, Portland, OR (US); Brent Carlton, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/024,419

(22) Filed: Sep. 17, 2020

(51) Int. Cl.
*H03L 7/197* (2006.01)
*H03L 7/099* (2006.01)
*H03L 7/091* (2006.01)

(52) U.S. Cl.
CPC ............ *H03L 7/1976* (2013.01); *H03L 7/091* (2013.01); *H03L 7/0998* (2013.01)

(58) Field of Classification Search
CPC ....... H03L 7/091; H03L 7/093; H03L 7/0991; H03L 7/0814; H03L 7/105; H03L 7/0992; H03L 7/0994; H03L 7/0998; H03L 7/1976
See application file for complete search history.

(56) References Cited

U.S. PATENT DOCUMENTS

| | | | | |
|---|---|---|---|---|
| 7,737,743 B1* | 6/2010 | Gao | ........................ | H03L 7/087 327/158 |
| 8,427,209 B2* | 4/2013 | Gao | ........................ | H03L 7/091 327/156 |
| 9,742,380 B1 | 8/2017 | Raj et al. | | |
| 10,972,109 B2* | 4/2021 | Kundu | .................... | H03L 7/091 |

OTHER PUBLICATIONS

Hedayati, Hiva et al., "A 1MHz-Bandwidth Type-I ΔΣ Fractional-N Synthesizer for WIMAX Applications", ISSCC 2009, Session 23, PLLs and Clocks, 23.1, 3 pgs.
Nandwana, Romesh K. et al., "A Calibration-Free Fractional-N Ring PLL Using Hybrid Phase/Current-Mode Phase Interpolation Method", IEEE Journal of Solid-State Circuits, vol. 50, No. 4, Apr. 2015, 14 pgs.
Sharma, Jahnavi et al., "A 2.4-GHz Reference-Sampling Phase-Locked Loop That Simultaneously Achieves Low-Noise and Low-Spur Performance", IEEE Journal of Solid-State Circuits, vol. 54, No. 5, May 2019, 18 pgs.
Shekhar, Sudip, "A 2.4-GHz Extended-Range Type-1 ΣΔ Fractional-N Synthesizer With 1.8-MHz Loop Bandwidth and—110-dBc/Hz Phase Noise", IEEE Transactions on Circuits and Systems-II: Express Briefs, vol. 58, No. 8, Aug. 2011, 5 pgs.

* cited by examiner

*Primary Examiner* — Hai L Nguyen
(74) *Attorney, Agent, or Firm* — Schwabe, Williamson & Wyatt, P.C.

(57) ABSTRACT

A reference sampling Type-I fractional-N PLL directly samples the reference clock and therefore does not use a reference buffer. Here, a phase-detector is a passive sampling switch which neither consumes any power nor generates any noise. Therefore, all the major contributors of in-band phase-noise are eliminated by the reference sampling Type-I fractional-N divider. A double sampling phase-detector with a switched-capacitor passive voltage interpolator circuit is used to achieve fractional-N output. To achieve a high resolution of the voltage interpolator or the switched capacitor, a sigma-delta modulator is used.

20 Claims, 8 Drawing Sheets

US 11,277,143 B1

REFERENCE SAMPLING TYPE-I FRACTIONAL-N PHASE LOCKED LOOP

BACKGROUND

Precise clock sources are used in any integrated circuit and system. These precise clock sources multiply a reference clock from a reference crystal oscillator to generate clock for the integrated circuit or system. The accuracy (e.g., jitter of the clock) is decided by the power consumption of the different intellectual property (IP) blocks inside the clock multiplier or phased-locked loop (PLL) which determines the figure-of-merit (FOM). Existing Type-I fraction-N PLLs suffer for large spurs that directly impact the accuracy of the PLL.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
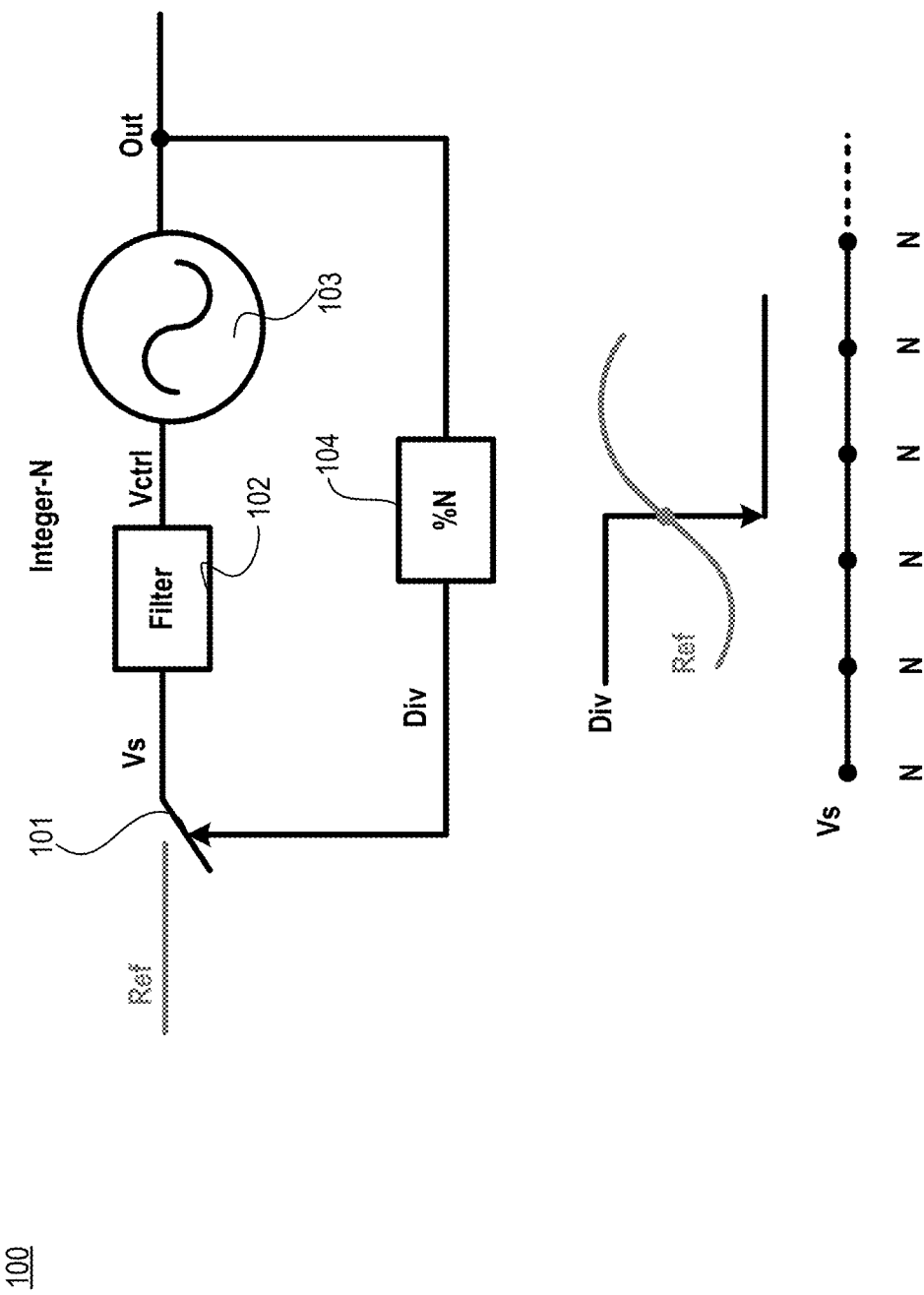
FIG. 1 illustrates a reference sampling Type-I integer-N phase locked loop (PLL).

In contrast to traditional Type-II Phase Locked Loop (PLL), Type-I PLLs have better FOM achieving sub-picosecond root-mean-square (RMS) jitter with less than 1 mW power dissipation, as the noise of the voltage-controlled-oscillator (VCO) can be suppressed more than in Type-II PLLs, through utilizing higher PLL bandwidth. However, designing Type-I PLL has some limitations.

First, the low-frequency in-band phase noise, which is primarily contributed by the reference clock buffer and charge-pump/phase-detector, increases significantly due to the higher PLL bandwidth. As a result, the reference buffer and charge-pump current consumption goes up to keep the noise low, which effectively degrades the FOM. Second, the generation of the fractional frequency multiplication ratio is not trivial in Type-I PLLs due to the complexity of the phase-detector implementation.

Various embodiments solve these issues by a reference sampling Type-I fractional-N PLL. This PLL directly samples the reference clock (a sine or cosine wave) and therefore does not use the reference buffer. In some embodiments, the phase-detector is a passive sampling switch which neither consumes any power nor generates any noise. Therefore, all the major contributors of in-band phase-noise are eliminated (or substantially eliminated) by the reference sampling Type-I fractional-N divider. In some embodiments, a double sampling phase-detector with a switched-capacitor passive voltage interpolator circuit is used to achieve fractional-N output. Using passive devices reduces power consumption.

The architecture of various embodiments provides a low complexity and low power design solution for the fractional-N clock generators. The reference sampling technique removes the reference clock buffer and the charge-pump which are the major contributors of noise and overall system power consumption. In addition, a fully passive switched-capacitor voltage interpolator is utilized for achieving fractional-N. The technique of various embodiments is independent of circuit topology and therefore can be utilized in both LC (inductor-capacitor) and ring oscillator based PLL architecture.

In some embodiments, the Type-I PLL comprises a sampler circuitry to sample a reference clock by two phases of a divided clock to generate a first voltage and a second voltage. In some embodiments, the PLL comprises an interpolator to interpolate the first voltage or a sampled version of the first voltage with the second voltage or a sampled version of the second voltage to generate a third voltage. In some embodiments, the PLL comprises an oscillator to receive the third voltage or a filtered version of the third voltage, wherein the third voltage is to control an oscillation frequency of the oscillator. In some embodiments, the sampler circuitry is a first sampler circuitry, wherein the divided clock is a first divided clock, wherein the phase locked loop comprises a second sampler circuitry to sample the first voltage and the second voltage by a second divided clock to generate the sampled version of the first voltage and the sampled version of the second voltage. In some embodiments, the second divided clock has a frequency is delayed relative to the first divided clock.

In some embodiments, the interpolator comprises a first weight and a second weight, wherein the first weight and the second weight are adjusted after a cycle of the reference clock. In some embodiments, the first weight corresponds to a first capacitance while the second weight corresponds to a second capacitance. In some embodiments, the two phases have a phase difference of a period that corresponds to the oscillation frequency. In some embodiments, the oscillator is voltage-controlled oscillator. In some embodiments, the oscillator is an LC oscillator. In some embodiments, the PLL comprises a frequency locked loop to coarsely adjust the oscillation frequency of the oscillator near a target oscillation frequency, wherein the third voltage is to finely adjust the oscillation frequency of the oscillator near the target oscillation frequency. In some embodiments, the PLL comprises a capacitor coupled to an output of the interpolator to filter the third voltage. In some embodiments, capacitance of the capacitor is substantially 1 pico-Farad (pF) or much less than 1 pF. In various embodiments, the reference clock is a sine wave.

There are many technical effects of the various embodiments. For example, lower power, lower complexity, and smaller form factor are achieved with the Type-I reference sampling fractional-N PLL compared to traditional Type-II PLLs. In some embodiments, low power is achieved using a passive reference sampling phase detector. The passive reference sampling phase detector greatly reduces the overall power consumption of the clock generator by removing the reference buffer and the charge-pump. Also, the Type-I loop has more noise suppression than traditional Type-II loop which reduces the oscillator power as well. Lower complexity is achieved by using a voltage interpolator based fractional-N generator. The voltage interpolator based fractional-N generator greatly simplifies the overall design as it may not use complex spur cancellation technique, delta-sigma based multi-modulo divider or current consuming digital-to-analog (DAC) converter. Smaller form factor is achieved due to the Type-I nature of the loop. In various embodiments, the loop filter capacitance is much smaller than the Type-II charge-pump PLL which helps to implement the PLL in a small form-factor. Other technical effects will be evident from the various figures and embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e g, immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "analog signal" is any continuous signal for which the time varying feature (variable) of the signal is a representation of some other time varying quantity, i.e., analogous to another time varying signal.

The term "digital signal" is a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and may be subsequently being reduced in layout area. In some cases, scaling also refers to upsizing a design from one process technology to another process technology and may be subsequently increasing layout area. The term "scaling" generally also refers to downsizing or upsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions.

It is pointed out that those elements of the figures having the same reference numbers (or names) as the elements of any other figure can operate or function in any manner similar to that described but are not limited to such.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

FIG. 1 illustrates a reference sampling Type-I integer-N phase locked loop (PLL) 100. PLL comprises sampling switch 101, filter 102, voltage-controlled oscillator (VCO) 103, and an integer-N divider. Reference clock (Ref) is sampled by switch 101. Filter 102 is coupled to switch 101 and filters voltage Vs to Vctrl. VCO 103 is coupled to filter 102, where VCO 103 generates an oscillating clock, Out. The oscillating clock Out is divided by divider 104 to generate Div clock. The divided VCO clock Div samples (on every Nth cycle or edge of clock Div) the sinusoidal reference Ref via sampling switch 101 and the sampled voltage Vs is low-pass filtered by filter 102. The output Vctrl of filter 102 is used to adjust the oscillating frequency of VCO 103. In comparison to a Type-II PLL, a Type-I PLL has the benefit of extending the bandwidth and thereby, provides better suppression of VCO noise. PLL 100 works well for integer-N Div clock (e.g., when Out clock is divided by an integer N to generate the Div clock). However, PLL 100 results in large frequency spur(s) when a fractional divider ratio is used for divider 104.

Figure 2:
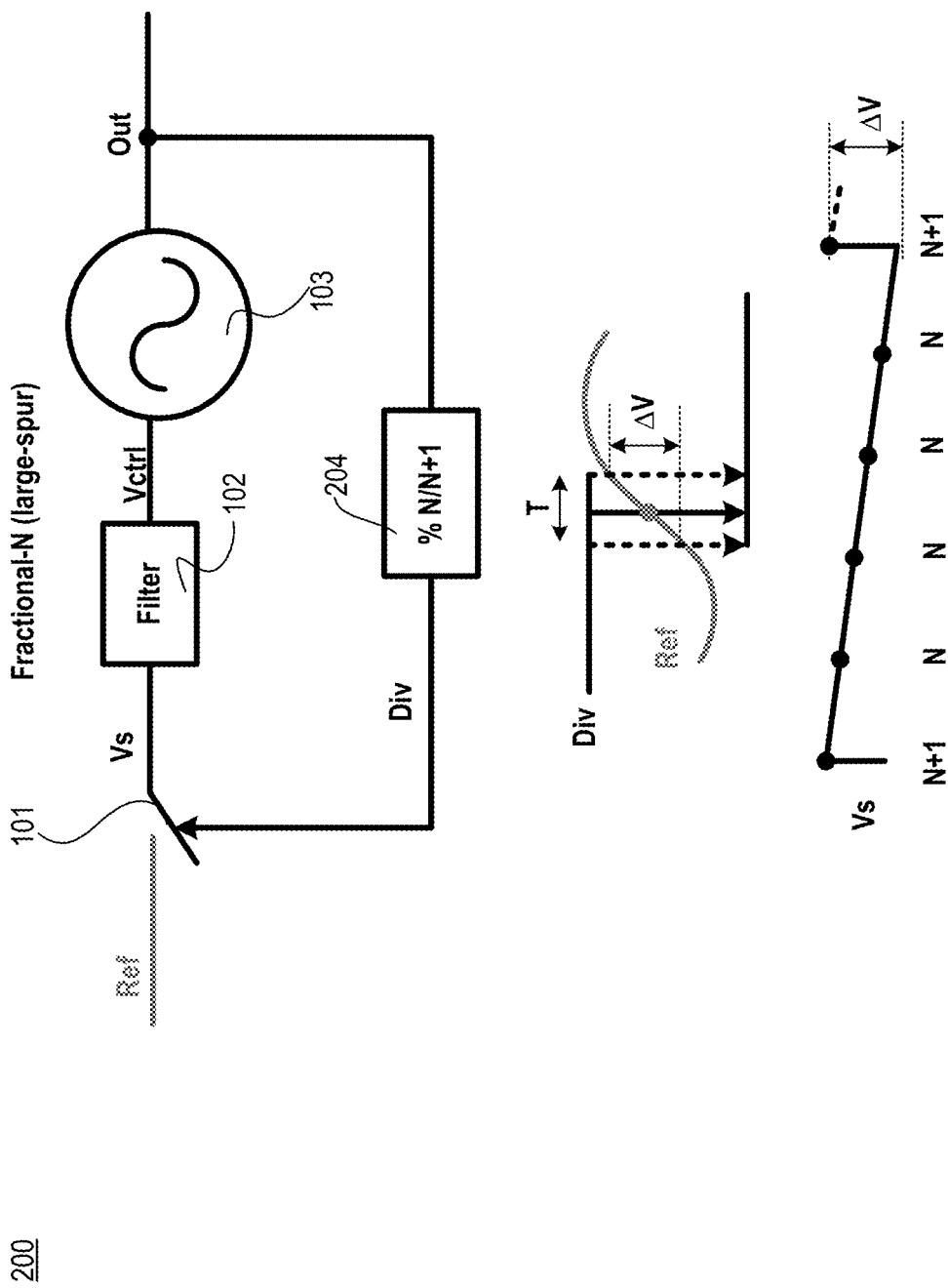
FIG. 2 illustrates a reference sampling Type-I fractional-N PLL without voltage interpolation.

FIG. 2 illustrates a reference sampling Type-I fractional-N PLL 200 without voltage interpolation. PLL 200 is similar to PLL 100 but for fractional divider 204. Fractional divider 204 divides clock Out either by integer N or by N+1 resulting into a fraction to generate clock Div. Achieving fractional-N in a reference sampling PLL is difficult, as any multi-modulo divider in the feedback path samples at a different time within a reference cycle whenever the division ratio changes. This generates large ripples in the control voltage Vs, which results in significant fractional spurs.

In this example, Out is divided by ⅕ (i.e., N+0.2). So, every fifth sample Ref clock (a sine wave) is sampled away from the center of the rising (or falling) slope resulting in a difference of delta V ($\Delta V$). This additional $\Delta V$ added to Vs causes a large frequency spur on Out, which is not desired as it directly degrades the jitter of the PLL.

Figure 3:
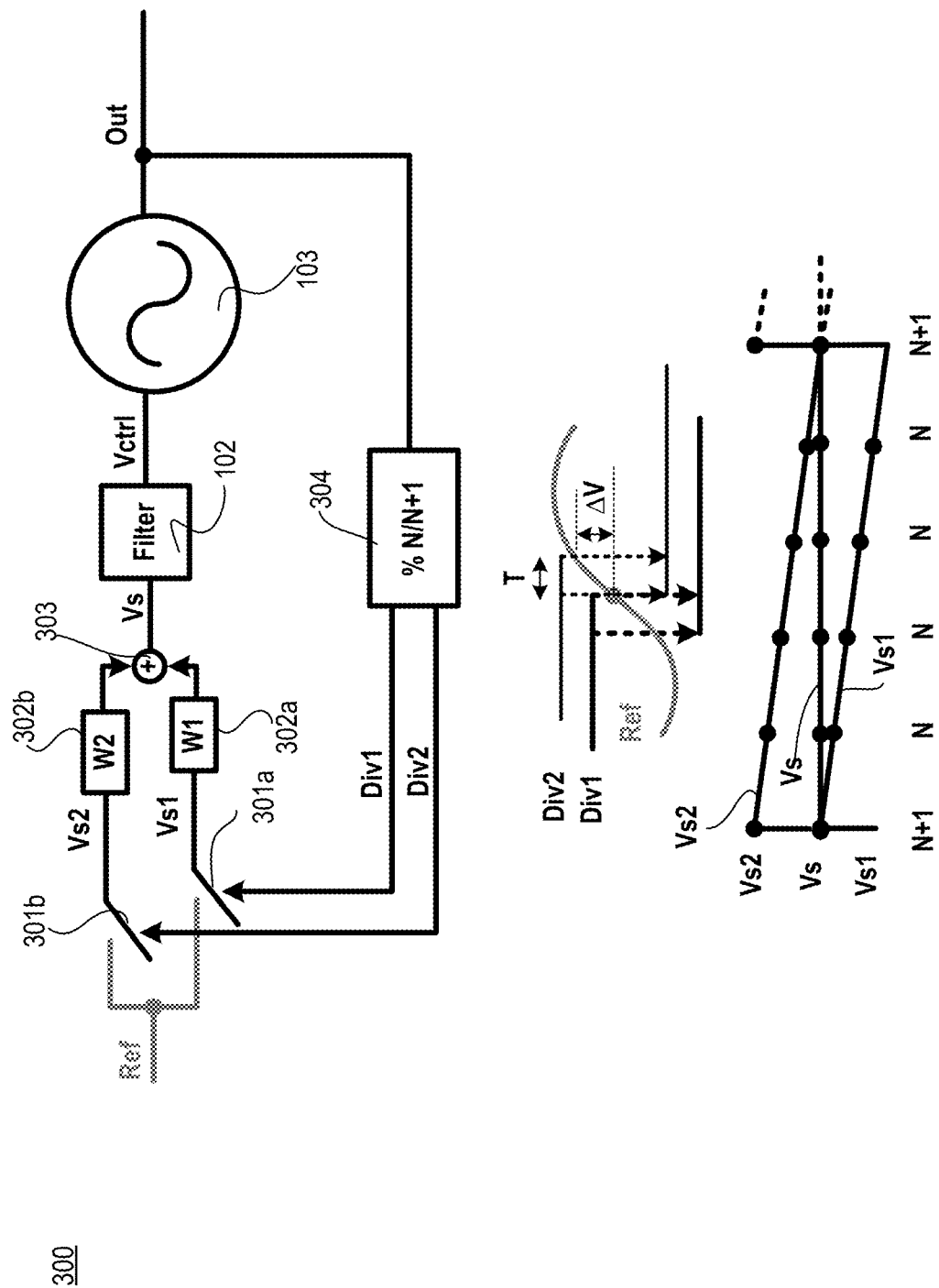
FIG. 3 illustrates a reference sampling Type-I fractional-N PLL with voltage interpolation, in accordance with some embodiments.

FIG. 3 illustrates a reference sampling Type-I fractional-N PLL 300 with voltage interpolation, in accordance with some embodiments. In some embodiments, PLL 300 samples the reference (Ref) twice by two phases of the divided clock (Div1, Div2) having a phase difference of one VCO period. In some embodiments, PLL 300 comprises a first sampler 301a, a second sampler 301b, a first weight unit 302a, a second weight unit 302b, a summing node 303, filter 102, oscillator (VCO) 103, and fractional divider 304. In various embodiments, fractional divider 304 generates Div1 and Div2 signals, which are frequency divided version of Out. In some embodiments, oscillator 103 is an LC oscillator with as bias input (coupled to Vs) and/or capacitor arrays to adjust oscillation frequency. In some embodiments, oscillator is a ring oscillator with a bias input (coupled to Vs) and/or capacitor arrays to adjust oscillation frequency. The output clock (Out) may be coupled as input to a clock distribution network and provided to various logic units. In some embodiments, the output clock (Out) is divided into different frequencies for different clock domains.

In some embodiments, the two sampled voltages (Vs1, Vs2) are interpolated to generate a steady VCO control-voltage Vs irrespective of the division ratio. This is done by periodically adjusting the interpolation weights W1 and W2 by blocks 302a and 302b, respectively, in every reference such that Vs=Vs1*W1+Vs2*W2 remains fixed even though Vs1 and Vs2 moves in every reference cycle depending on the fractional ratio of divider 304. As such, in the example of N+0.2 divider ration, the $\Delta V$ additional voltage seen on Vs1 and/or Vs2 is cancelled by summing node 303 resulting in a flat Vs.

Figure 4:
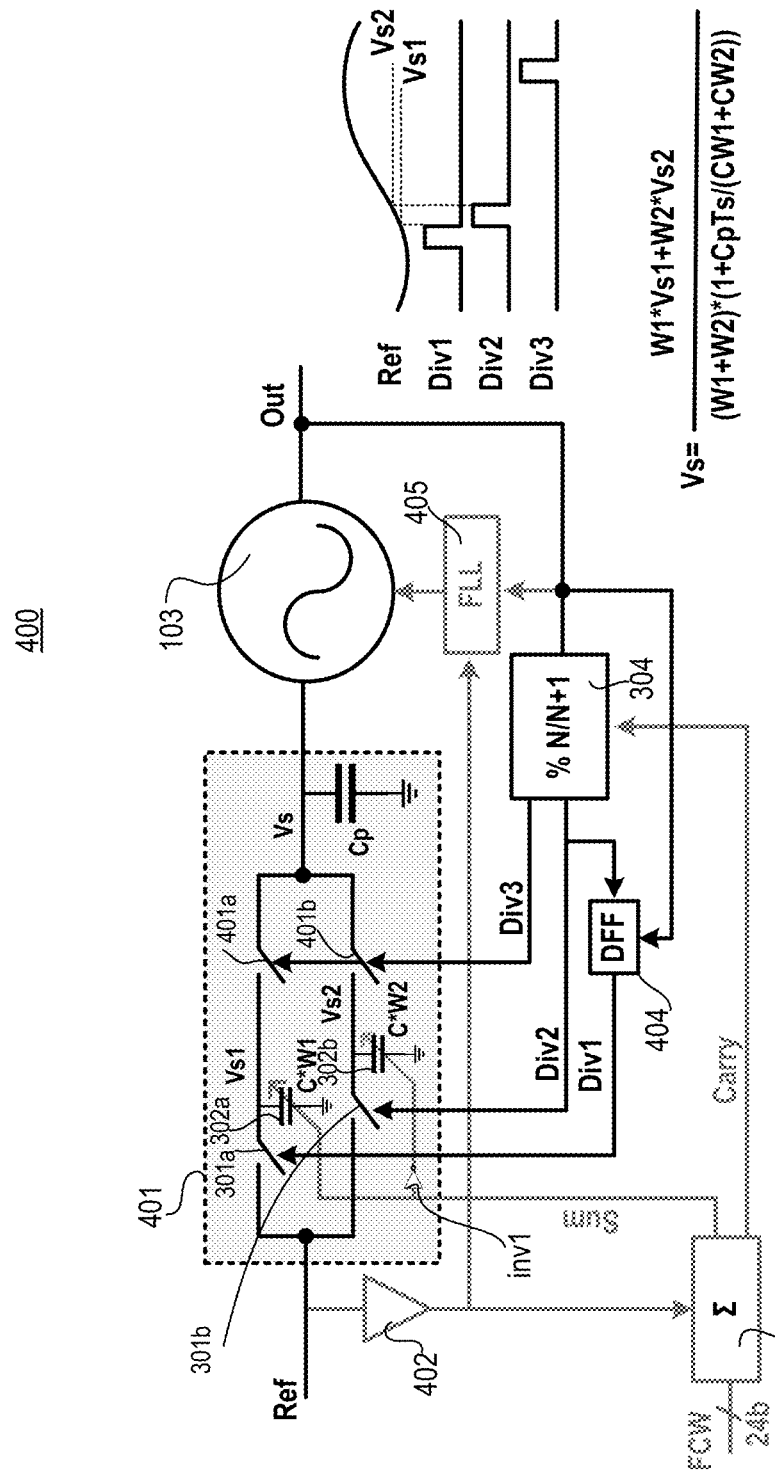
FIG. 4 illustrates a detailed view of the reference sampling Type-I fractional-N PLL, in accordance with some embodiments.

FIG. 4 illustrates a reference sampling Type-I fractional-N PLL 400, in accordance with some embodiments. PLL 400 provides more details to conceptual schematic of PLL 300. In some embodiments, PLL 400 comprises reference sampling and voltage interpolation circuitry 401 coupled to oscillator 103. PLL 400 further comprises third switch 401a, fourth switch 401b, buffer 402, summer or adder 403, data flip-flop (DFF) 404 or an edge triggered sequential unit, frequency locked loop (FLL) 405, and fractional divider 304. In some embodiments, reference sampling and voltage interpolation circuitry 401 comprises first sampling switch 301a, second sampling switch 301b, adjustable capacitor 302a (first weight unit), adjustable capacitor 302b (second weight unit), inverter inv1, and filter capacitor Cp.

In various embodiments, divider 304 generates three frequency divided clocks Div1, Div2, and Div3. In some embodiments, Div1 and Div2 are used for sampling Ref while Div3 is used for performing voltage interpolation of Vs1 and Vs2. Div1 and Div2 are separated by a phase of a period of Out. In some embodiments, Div3 is used to control third switch 401a and fourth switch 401b to sample Vs1 and Vs2. The sampled Vs1 and Vs2 are then interpolated or integrated at a common node to generate Vs. In some embodiments, the transition of Div3 is much later than Div1 and Div3. Relative delay of Div3 is selected to give enough time for Vs1 and Vs2 to settle before they are integrated to generate Vs.

In some embodiments, reference sampling and voltage interpolation circuitry 401 is implemented with a circuitry that converts Vs1 and Vs2 to current domain using transconductor and performs the interpolation by adding current branches. The weights can also be adjusted by adjusting transistor size. In some embodiments, reference sampling and voltage interpolation circuitry 401 comprises a switched-capacitor based voltage interpolator. In some embodiments, VCO divided clocks Div1, Div2 are used to sample the reference which are then stored in two sets of switched capacitors 302a C*W1 and 302b C*W2, where C is capacitance of each unit. In some embodiments, weights are determined from the fractional ratio provided by fractional control word (FCW). FCW code is accumulated and the Sum is applied as weights. The weights W1 and W2 determine the number of switched capacitors that will be turned on to generate capacitances of C*W1 and C*W2, respectively. For example, in case of a 6-bit implementation, if Sum=10, 302a has 10 capacitors connected in parallel, and 302b will have 64−10=54 parallel capacitors.

In some embodiments, weights are calculated using accumulator 403 with W2, the complement of W1, implemented by inverter inv1. The weights are a ramping value whose ramp rate will be related to the fractional frequency offset from the integer ratio. In some embodiments, voltage interpolation is performed by sharing the charges of the capacitors C by another set of switches which connects them with the loop filter capacitor (Cp). This switched capacitor-based implementation is fully passive, and dissipates merely clock power and the KT/C noise can be made negligibly small with a reasonably small capacitance (e.g., less than or substantially 1 pF for Cp). Conversely, typical Type-II PLLs have a filter capacitance of around 50 pF.

In some embodiments, the weights (W1, W2) are calculated by accumulating the fractional control word (FCW). FCW is added to a number that starts at zero (or any known value) and increments by FCW every Ref clock cycle generated by buffer 402. When accumulator 403 output overflows, Carry will go high, indicating one full VCO period jump required. In some embodiments, Carry will cause adding 1 to the division ratio in divider 304 with N being the integer division ratio. Sum will wrap back after overflow with the modulo of the next accumulator value. In some embodiments, Sum controls the weights by adjusting the capacitance of 302a and 302b. Here, W1 corresponds to the number of unit capacitors to be connected in parallel to realize total capacitor of C*W1. While a 24-bit word is shown for the FCW, any number of bits can be used for FCW. Frequency of signal Out will be defined as $N(1+FCW/2^{width(FCW)})$ times the frequency of Ref. Both N and FCW would be defined by system output clock required. In some embodiments, FCW is provided externally and it is set depending on the application requirement. For a given FCW, the output frequency resolution is $Fref/2^{FCW}$, where Fref is the reference clock frequency. This is well known in any Fractional-N PLL In some embodiments, FLL 405 coarsely tunes the VCO frequency before the main phase-locking operation. As such, Vs provides the fine tuning while FLL 405 compares the frequency of Out relative to the reference Ref and adjusts the oscillating frequency of VCO 103 to set Out close to the desired frequency. For example, the output of FLL 405 adjusts a capacitor bank to change a loading condition, which in turn changes the oscillating frequency. Note, that the switched capacitor network can be treated as a resistor which follows the load capacitor Cp to inherently provide a first-order low pass filter having cut-off frequency fref*C (W1+W2)/Cp. This also simplifies the design by eliminating an explicit filter.

In some embodiments, the capacitors (e.g., C and Cp) are implemented as passive devices. In some embodiments, capacitors are implemented as metal-insulator-metal (MIM) capacitors, ferroelectric capacitors, metal capacitors, discrete capacitors, transistors configured as capacitors or a combination of them.

FIGS. 5A-D illustrate a set of plots 500 and 520 showing transient simulation and output spectrum without voltage interpolation, respectively. Here, N=32.0625 using a reference clock of 40 MHz. Plots 500 and 520 show the performance when the voltage interpolator is disabled i.e. the architecture in FIG. 2. Here, frequency of Out (Fout) oscillates because Vs oscillates for reasons discussed with reference to FIG. 2.

Figure 5A:
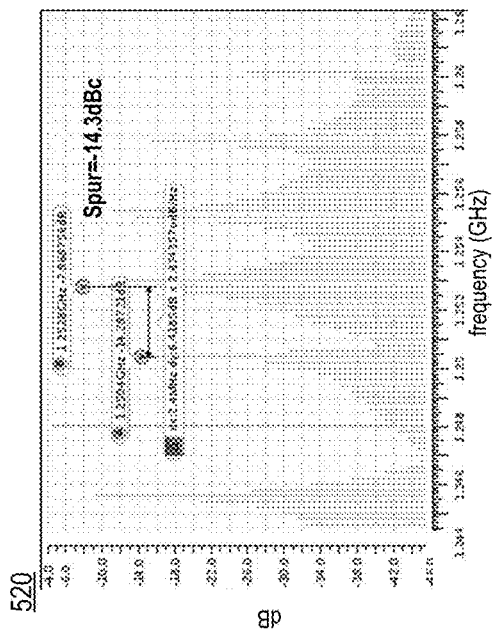
FIGS. 5A-B illustrate a set of plots showing transient simulation and output spectrum without voltage interpolation.
Figure 5B:
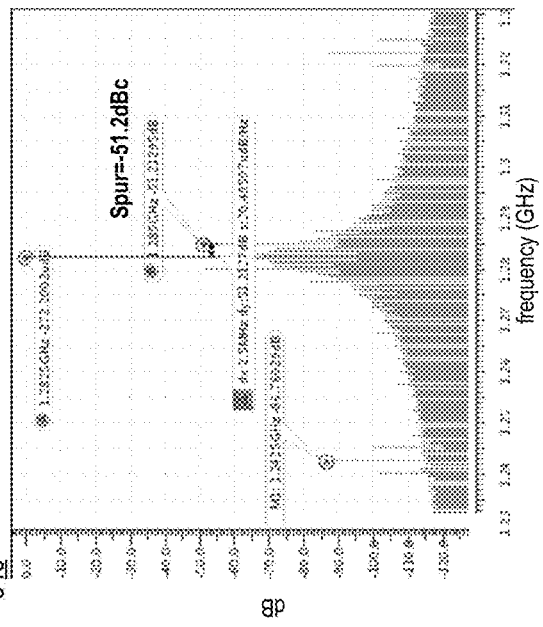
Figure 5C:
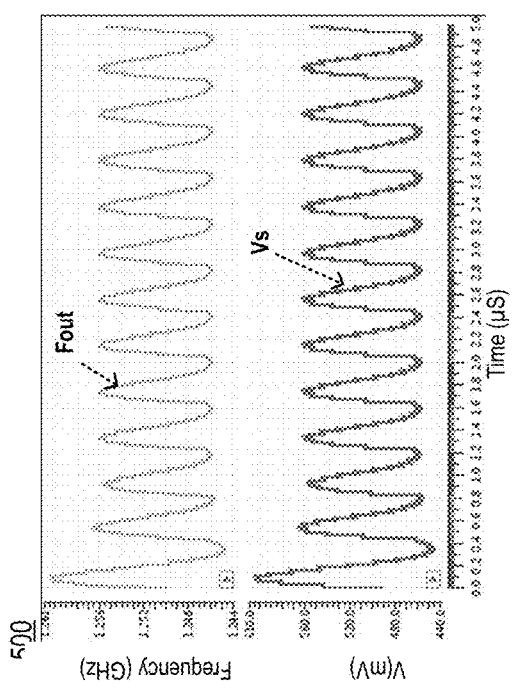
FIGS. 5C-D illustrate a set of plots showing transient simulation and output spectrum with voltage interpolation, in accordance with some embodiments.
Figure 5D:
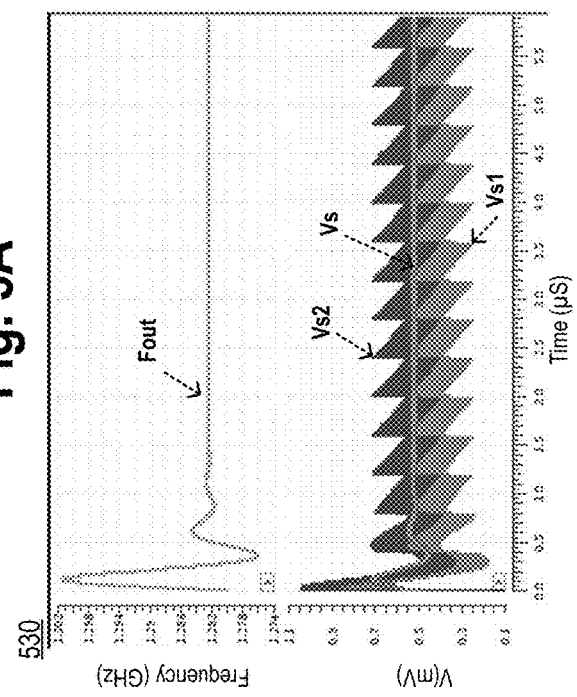

FIGS. 5C-D illustrate a set of plots 530 and 540 showing transient simulation and output spectrum with voltage interpolation, respectively, in accordance with some embodiments. Here, although Vs1, Vs2 generates sawtooth waveforms of frequency 40 MHz*0.0625=2.5 MHz, the interpolated voltage Vs which goes to the VCO stays flat as discussed with reference to FIGS. 3-4. In this example, the fractional spurs which appears at the offset of 2.5 MHz is only −51.2 dBc, as observed from the output spectrum.

Figure 6:
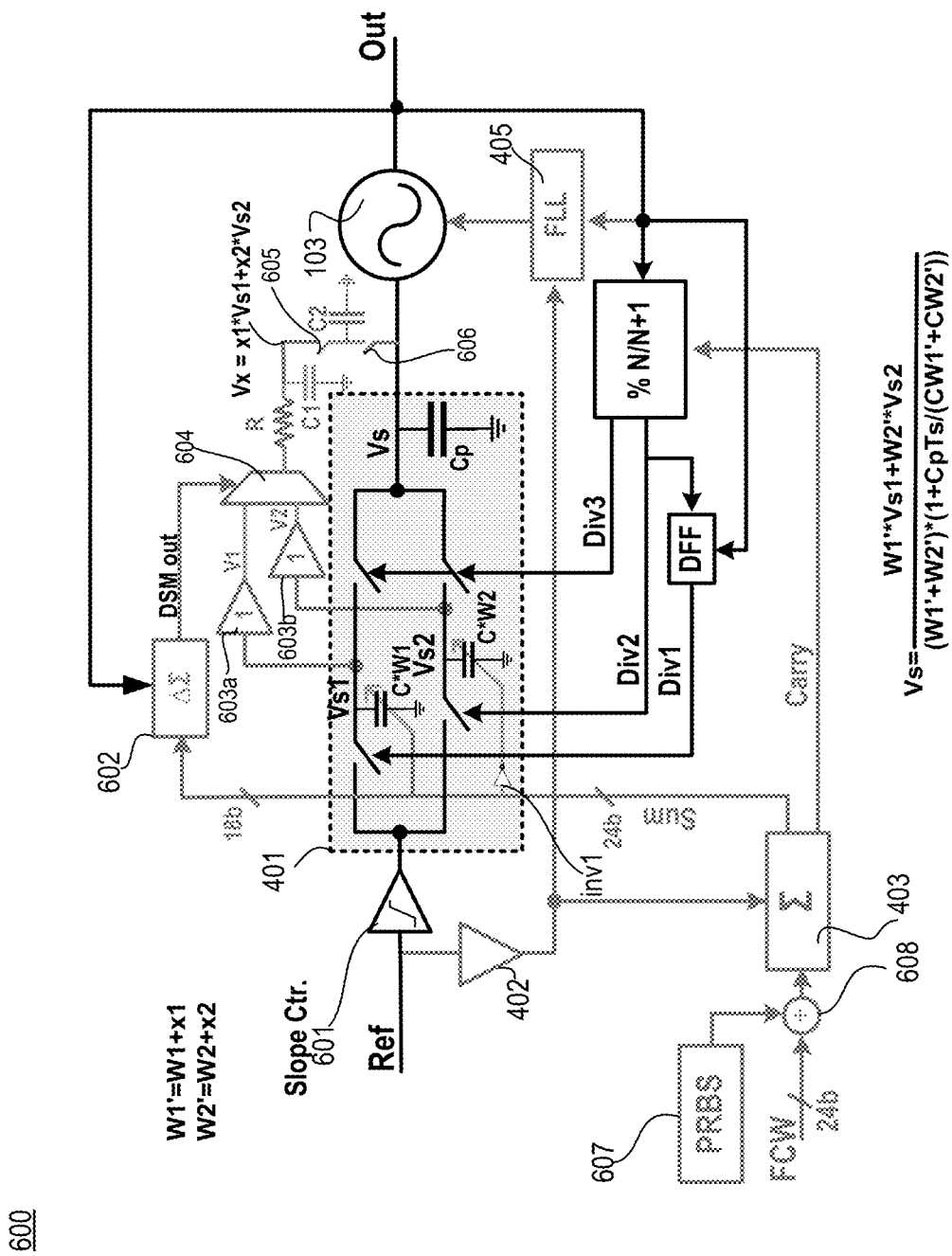
FIG. 6 illustrates a reference sampling Type-I fractional-N PLL with delta-sigma digital-to-analog converter (DAC) to improve the resolution of the voltage interpolator, in accordance with some embodiments.

FIG. 6 illustrates a reference sampling Type-I fractional-N PLL 600 with delta-sigma digital-to-analog converter (DAC) to improve the resolution of the voltage interpolator, in accordance with some embodiments. The resolution of the voltage interpolator or the switched capacitor is decided from the resolution of the output clock frequency. For example, an N-bit voltage interpolator achieves output frequency resolution of $fref/2^N$. Therefore, achieving a very high frequency resolution require a large array of switched-capacitor units to implement the voltage interpolator which may introduce non-linearity due to mismatch among different units. This non-linearity correction may use several complex calibration techniques.

To improve linearity and simplify calibration, a delta-sigma modulator (DSM) DAC is added, in accordance with some embodiments. In some embodiments, PLL 600 comprises components of PLL 400 and slope controller 601, delta-sigma modulator (DSM) 602, first buffer 603a, second buffer 603b, multiplexer 604, resistor R, capacitor C1, first switch 605, second switch 606, capacitor C2, pseudo-random binary sequence (PRBS) generator 607, and summation node 608 coupled as shown.

The most significant bits (MSBs) of the weights W1, W2 directly goes to the switched capacitor while the least significant bits (LSBs) of the weights W1, W2 go to a first order DSM of 1-bit output which operates at the high-frequency VCO clock (CKvco). In this implementation higher 6-bit of the 24-bit sum controls the switched-capacitor and lower 18-bit of the 240 bit sum goes to DSM 602. So, DSM 602 is activated when finer than $fref/2^6$ frequency resolution is required from PLL 600. In some embodiments, DSM output (DSM out) then then goes to a 2:1 sampling multiplexer (MUX) 604 to generate an intermediate voltage (Vx) by filtering the output of MUX 604. In various embodiments, Vx is stored in a unit cap (C) and introduced during the charge sharing step of the voltage interpolator.

In some embodiments, slope controller 601 is used as an optional block to improve the linearity and gain of the PLL. For example, slope controller 601 block controls the rise time of Ref. In some embodiments, PRBS 607 adds a pseudo-random number with FCW and thus breaks any periodic pattern in Sum/carry bits. Note, any periodic pattern can appear as spurious frequency tone. In some embodiments, buffer 603a/b is a unity gain buffer that buffers V1 and V2 to Vs1 and Vs2, respectively. Without buffer 603a/b, the switching operation of 604 may disturb Vs1 and Vs2. In some embodiments, filter R/C1 filters out the high frequency switching noise of 604. In some embodiments, C2=C i.e. unit capacitor in main switched capacitor array 401. In some embodiments, second switch 606 is controlled by Div3, and first switch 605 is controlled by invert-of-Div3.

In some embodiments, the resistor is implemented as a discrete resistor, a resistor offered by a process technology node, a transistor configured as a resistor, or a combination of them. In some embodiments, the capacitors (e.g., C, C1, C2, and Cp) are implemented as passive devices. In some embodiments, capacitors are implemented as metal-insulator-metal (MIM) capacitors, ferroelectric capacitors, metal capacitors, discrete capacitors, transistors configured as capacitors or a combination of them.

Figures 7A, 7B:
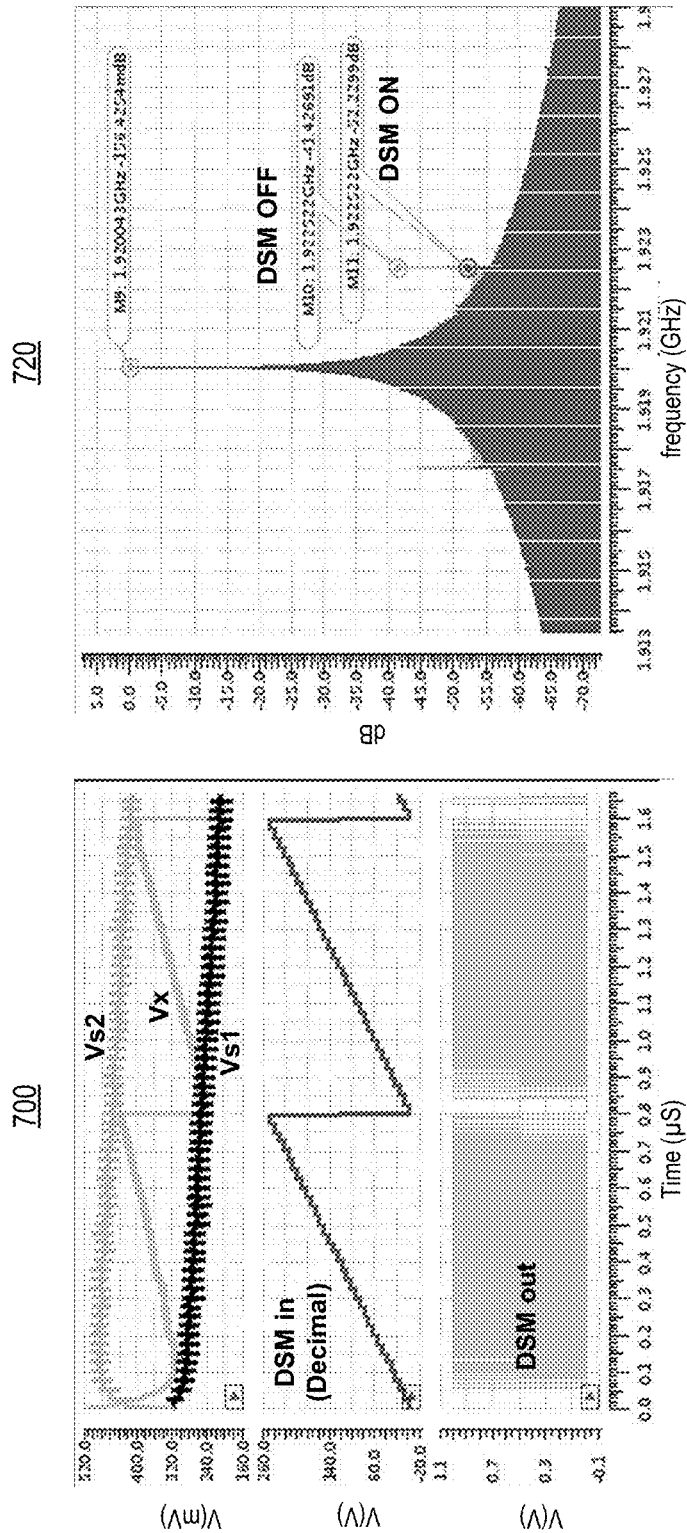
FIGS. 7A-B illustrate a set of plots showing transient simulation and output spectrum with voltage interpolation, in accordance with some embodiments.

In various embodiments, PLL 300 (400 and/or 600) is used as a first PLL that receives a reference clock from a crystal oscillator. The reference clock directly from the crystal oscillator is a sine wave. In various embodiments, without buffering the sine wave, PLL 300 can generate a phase locked clock by sampling the reference as discussed herein FIGS. 7A-B illustrates a set of plots 700 and 720 showing transient simulation and output spectrum with voltage interpolation, respectively, in accordance with some embodiments. As evident from plot 700, Vx is proportional to the DSM input i.e. the LSBs of Sum. The benefit of DSM 602 is observed from the output spectrum in plot 720 for $N=48+\frac{1}{2}^{10}$. When DSM 602 is disable, the fractional spurs are as high as −41.4 dBc due to the degraded resolution of the voltage interpolator which goes below −52 dBc when DSM 602 is enabled. Note, that DSM 602 based digital-to-analog converter (DAC) has its own delay to converge to the desired value which eventually decides its resolution. But this delay appears in the PLL loop degrading the stability. This puts a limit on the resolution we can achieve from the DAC. In this implementation half reference clock period delay is introduced which turns out to be an optimum value.

Figure 8:
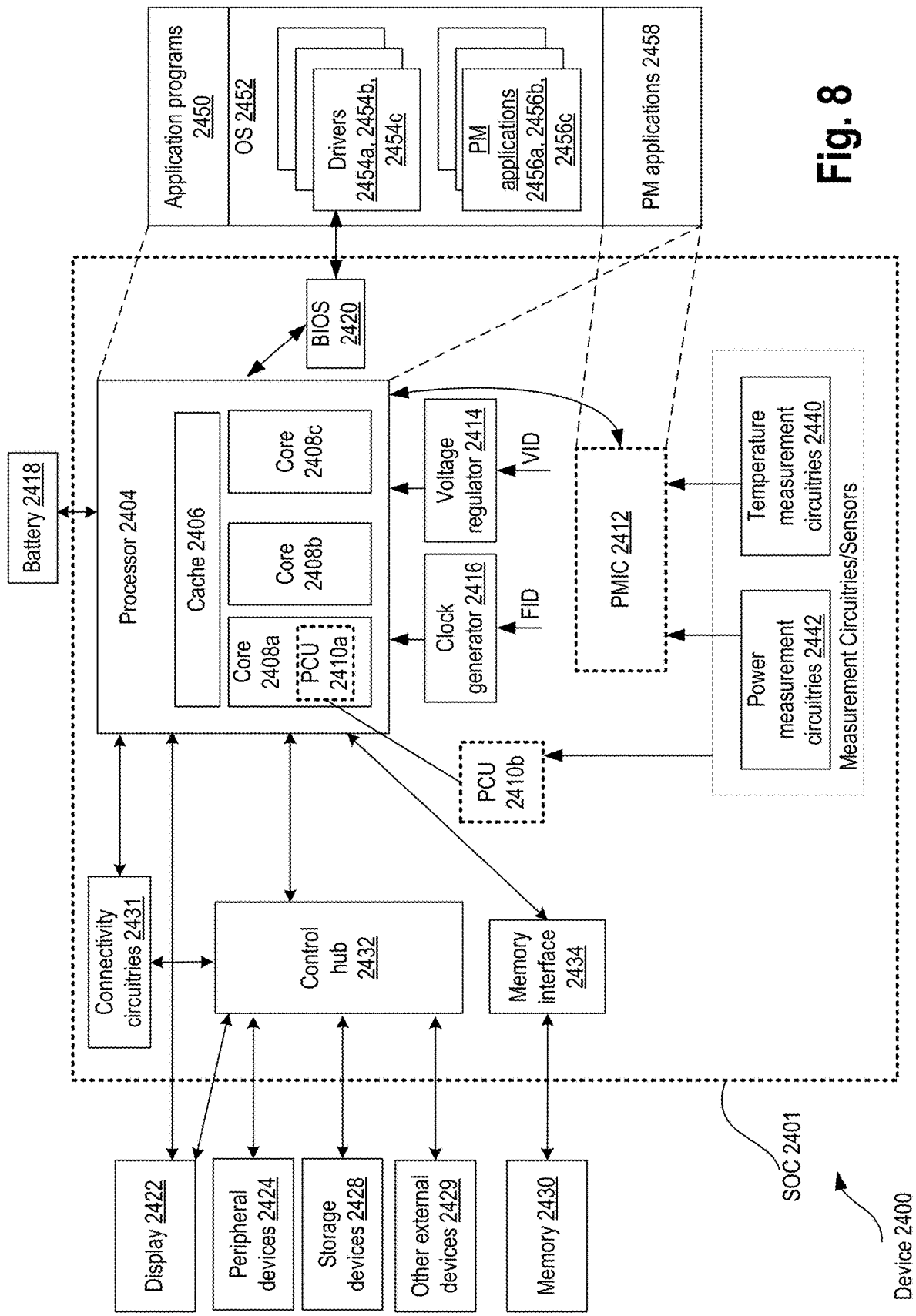
FIG. 8 illustrates a smart device or a computer system or a SoC (System-on-Chip) having a reference sampling Type-I fractional-N PLL, in accordance with some embodiments.

FIG. 8 illustrates a smart device or a computer system or a SoC (System-on-Chip) having a reference sampling Type-I fractional-N PLL, in accordance with some embodiments. In some embodiments, device 2400 represents an appropriate computing device, such as a computing tablet, a mobile phone or smart-phone, a laptop, a desktop, an Internet-of-Things (IOT) device, a server, a wearable device, a set-top box, a wireless-enabled e-reader, or the like. It will be understood that certain components are shown generally, and not all components of such a device are shown in device 2400.

In an example, the device 2400 comprises an SoC (System-on-Chip) 2401. An example boundary of the SoC 2401 is illustrated using dotted lines in FIG. 8, with some example components being illustrated to be included within SoC 2401—however, SoC 2401 may include any appropriate components of device 2400.

In some embodiments, device 2400 includes processor 2404. Processor 2404 can include one or more physical devices, such as microprocessors, application processors, microcontrollers, programmable logic devices, processing cores, or other processing means. The processing operations performed by processor 2404 include the execution of an operating platform or operating system on which applications and/or device functions are executed. The processing operations include operations related to I/O (input/output) with a human user or with other devices, operations related to power management, operations related to connecting computing device 2400 to another device, and/or the like. The processing operations may also include operations related to audio I/O and/or display I/O.

In some embodiments, processor 2404 includes multiple processing cores (also referred to as cores) 2408*a*, 2408*b*, 2408*c*. Although merely three cores 2408*a*, 2408*b*, 2408*c* are illustrated in FIG. 8, processor 2404 may include any other appropriate number of processing cores, e.g., tens, or even hundreds of processing cores. Processor cores 2408*a*, 2408*b*, 2408*c* may be implemented on a single integrated circuit (IC) chip. Moreover, the chip may include one or more shared and/or private caches, buses or interconnections, graphics and/or memory controllers, or other components.

In some embodiments, processor 2404 includes cache 2406. In an example, sections of cache 2406 may be dedicated to individual cores 2408 (e.g., a first section of cache 2406 dedicated to core 2408*a*, a second section of cache 2406 dedicated to core 2408*b*, and so on). In an example, one or more sections of cache 2406 may be shared among two or more of cores 2408. Cache 2406 may be split in different levels, e.g., level 1 (L1) cache, level 2 (L2) cache, level 3 (L3) cache, etc.

In some embodiments, processor core 2404 may include a fetch unit to fetch instructions (including instructions with conditional branches) for execution by the core 2404. The instructions may be fetched from any storage devices such as the memory 2430. Processor core 2404 may also include a decode unit to decode the fetched instruction. For example, the decode unit may decode the fetched instruction into a plurality of micro-operations. Processor core 2404 may include a schedule unit to perform various operations associated with storing decoded instructions. For example, the schedule unit may hold data from the decode unit until the instructions are ready for dispatch, e.g., until all source values of a decoded instruction become available. In one embodiment, the schedule unit may schedule and/or issue (or dispatch) decoded instructions to an execution unit for execution.

The execution unit may execute the dispatched instructions after they are decoded (e.g., by the decode unit) and dispatched (e.g., by the schedule unit). In an embodiment, the execution unit may include more than one execution unit (such as an imaging computational unit, a graphics computational unit, a general-purpose computational unit, etc.). The execution unit may also perform various arithmetic operations such as addition, subtraction, multiplication, and/or division, and may include one or more an arithmetic logic units (ALUs). In an embodiment, a co-processor (not shown) may perform various arithmetic operations in conjunction with the execution unit.

Further, execution unit may execute instructions out-of-order. Hence, processor core 2404 may be an out-of-order processor core in one embodiment. Processor core 2404 may also include a retirement unit. The retirement unit may retire executed instructions after they are committed. In an embodiment, retirement of the executed instructions may result in processor state being committed from the execution of the instructions, physical registers used by the instructions being de-allocated, etc. Processor core 2404 may also include a bus unit to enable communication between components of processor core 2404 and other components via one or more buses. Processor core 2404 may also include one or more registers to store data accessed by various components of the core 2404 (such as values related to assigned app priorities and/or sub-system states (modes) association.

In some embodiments, device 2400 comprises connectivity circuitries 2431. For example, connectivity circuitries 2431 includes hardware devices (e.g., wireless and/or wired connectors and communication hardware) and/or software components (e.g., drivers, protocol stacks), e.g., to enable device 2400 to communicate with external devices. Device 2400 may be separate from the external devices, such as other computing devices, wireless access points or base stations, etc.

In an example, connectivity circuitries 2431 may include multiple different types of connectivity. To generalize, the connectivity circuitries 2431 may include cellular connectivity circuitries, wireless connectivity circuitries, etc. Cellular connectivity circuitries of connectivity circuitries 2431 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. Wireless connectivity circuitries (or wireless interface) of the connectivity circuitries 2431 refers to wireless connectivity that is not cellular, and can include personal area networks (such as Bluetooth, Near Field, etc.), local area networks (such as Wi-Fi), and/or wide area networks (such as WiMax), and/or other wireless communication. In an example, connectivity circuitries 2431 may include a network interface, such as a wired or wireless interface, e.g., so that a system embodiment may be incorporated into a wireless device, for example, a cell phone or personal digital assistant.

In some embodiments, device 2400 comprises control hub 2432, which represents hardware devices and/or software components related to interaction with one or more I/O devices. For example, processor 2404 may communicate with one or more of display 2422, one or more peripheral devices 2424, storage devices 2428, one or more other external devices 2429, etc., via control hub 2432. Control hub 2432 may be a chipset, a Platform Control Hub (PCH), and/or the like.

For example, control hub 2432 illustrates one or more connection points for additional devices that connect to device 2400, e.g., through which a user might interact with the system. For example, devices (e.g., devices 2429) that can be attached to device 2400 include microphone devices, speaker or stereo systems, audio devices, video systems or other display devices, keyboard or keypad devices, or other I/O devices for use with specific applications such as card readers or other devices.

As mentioned above, control hub 2432 can interact with audio devices, display 2422, etc. For example, input through a microphone or other audio device can provide input or commands for one or more applications or functions of device 2400. Additionally, audio output can be provided instead of, or in addition to display output. In another example, if display 2422 includes a touch screen, display 2422 also acts as an input device, which can be at least partially managed by control hub 2432. There can also be additional buttons or switches on computing device 2400 to provide I/O functions managed by control hub 2432. In one embodiment, control hub 2432 manages devices such as accelerometers, cameras, light sensors or other environmental sensors, or other hardware that can be included in device 2400. The input can be part of direct user interaction, as well as providing environmental input to the system to influence its operations (such as filtering for noise, adjusting displays for brightness detection, applying a flash for a camera, or other features).

In some embodiments, control hub 2432 may couple to various devices using any appropriate communication protocol, e.g., PCIe (Peripheral Component Interconnect Express), USB (Universal Serial Bus), Thunderbolt, High Definition Multimedia Interface (HDMI), Firewire, etc.

In some embodiments, display 2422 represents hardware (e.g., display devices) and software (e.g., drivers) components that provide a visual and/or tactile display for a user to interact with device 2400. Display 2422 may include a display interface, a display screen, and/or hardware device used to provide a display to a user. In some embodiments, display 2422 includes a touch screen (or touch pad) device that provides both output and input to a user. In an example, display 2422 may communicate directly with the processor 2404. Display 2422 can be one or more of an internal display device, as in a mobile electronic device or a laptop device or an external display device attached via a display interface (e.g., DisplayPort, etc.). In one embodiment display 2422 can be a head mounted display (HMD) such as a stereoscopic display device for use in virtual reality (VR) applications or augmented reality (AR) applications.

In some embodiments, and although not illustrated in the figure, in addition to (or instead of) processor 2404, device 2400 may include Graphics Processing Unit (GPU) comprising one or more graphics processing cores, which may control one or more aspects of displaying contents on display 2422.

Control hub 2432 (or platform controller hub) may include hardware interfaces and connectors, as well as software components (e.g., drivers, protocol stacks) to make peripheral connections, e.g., to peripheral devices 2424.

It will be understood that device 2400 could both be a peripheral device to other computing devices, as well as have peripheral devices connected to it. Device 2400 may have a "docking" connector to connect to other computing devices for purposes such as managing (e.g., downloading and/or uploading, changing, synchronizing) content on device 2400. Additionally, a docking connector can allow device 2400 to connect to certain peripherals that allow computing device 2400 to control content output, for example, to audiovisual or other systems.

In addition to a proprietary docking connector or other proprietary connection hardware, device 2400 can make peripheral connections via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, connectivity circuitries 2431 may be coupled to control hub 2432, e.g., in addition to, or instead of, being coupled directly to the processor 2404. In some embodiments, display 2422 may be coupled to control hub 2432, e.g., in addition to, or instead of, being coupled directly to processor 2404.

In some embodiments, device 2400 comprises memory 2430 coupled to processor 2404 via memory interface 2434. Memory 2430 includes memory devices for storing information in device 2400.

In some embodiments, memory 2430 includes apparatus to maintain stable clocking as described with reference to various embodiments. Memory can include nonvolatile (state does not change if power to the memory device is interrupted) and/or volatile (state is indeterminate if power to the memory device is interrupted) memory devices. Memory device 2430 can be a dynamic random-access memory (DRAM) device, a static random-access memory (SRAM) device, flash memory device, phase-change memory device, or some other memory device having suitable performance to serve as process memory. In one embodiment, memory 2430 can operate as system memory for device 2400, to store data and instructions for use when the one or more processors 2404 executes an application or process. Memory 2430 can store application data, user data, music, photos, documents, or other data, as well as system data (whether long-term or temporary) related to the execution of the applications and functions of device 2400.

Elements of various embodiments and examples are also provided as a machine-readable medium (e.g., memory 2430) for storing the computer-executable instructions (e.g., instructions to implement any other processes discussed herein). The machine-readable medium (e.g., memory 2430) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, device 2400 comprises temperature measurement circuitries 2440, e.g., for measuring temperature of various components of device 2400. In an example, temperature measurement circuitries 2440 may be embedded, or coupled or attached to various components, whose temperature are to be measured and monitored. For example, temperature measurement circuitries 2440 may measure temperature of (or within) one or more of cores 2408*a*, 2408*b*, 2408*c*, voltage regulator 2414, memory 2430, a mother-board of SoC 2401, and/or any appropriate component of device 2400.

In some embodiments, device 2400 comprises power measurement circuitries 2442, e.g., for measuring power consumed by one or more components of the device 2400. In an example, in addition to, or instead of, measuring power, the power measurement circuitries 2442 may measure voltage and/or current. In an example, the power measurement circuitries 2442 may be embedded, or coupled or attached to various components, whose power, voltage, and/or current consumption are to be measured and monitored. For example, power measurement circuitries 2442 may measure power, current and/or voltage supplied by one or more voltage regulators 2414, power supplied to SoC 2401, power supplied to device 2400, power consumed by processor 2404 (or any other component) of device 2400, etc.

In some embodiments, device 2400 comprises one or more voltage regulator circuitries, generally referred to as voltage regulator (VR) 2414. VR 2414 generates signals at appropriate voltage levels, which may be supplied to operate any appropriate components of the device 2400. Merely as an example, VR 2414 is illustrated to be supplying signals to processor 2404 of device 2400. In some embodiments, VR 2414 receives one or more Voltage Identification (VID) signals, and generates the voltage signal at an appropriate level, based on the VID signals. Various type of VRs may be utilized for the VR 2414. For example, VR 2414 may include a "buck" VR, "boost" VR, a combination of buck and boost VRs, low dropout (LDO) regulators, switching DC-DC regulators, constant-on-time controller-based DC-DC regulator, etc. Buck VR is generally used in power delivery applications in which an input voltage needs to be transformed to an output voltage in a ratio that is smaller than unity. Boost VR is generally used in power delivery applications in which an input voltage needs to be transformed to an output voltage in a ratio that is larger than unity. In some embodiments, each processor core has its own VR, which is controlled by PCU 2410*a/b* and/or PMIC 2412. In some embodiments, each core has a network of distributed LDOs to provide efficient control for power management. The LDOs can be digital, analog, or a combination of digital or analog LDOs. In some embodiments, VR 2414 includes current tracking apparatus to measure current through power supply rail(s).

In some embodiments, VR 2414 includes a digital control scheme to manage states of a proportional-integral-derivative (PID) filter (also known as a digital Type-III compensator). The digital control scheme controls the integrator of the PID filter to implement non-linear control of saturating the duty cycle during which the proportional and derivative terms of the PID are set to 0 while the integrator and its internal states (previous values or memory) is set to a duty cycle that is the sum of the current nominal duty cycle plus a deltaD. The deltaD is the maximum duty cycle increment that is used to regulate a voltage regulator from ICCmin to ICCmax and is a configuration register that can be set post silicon. A state machine moves from a non-linear all ON state (which brings the output voltage Vout back to a regulation window) to an open loop duty cycle which maintains the output voltage slightly higher than the required reference voltage Vref. After a certain period in this state of open loop at the commanded duty cycle, the state machine then ramps down the open loop duty cycle value until the output voltage is close to the Vref commanded. As such, output chatter on the output supply from VR 2414 is completely eliminated (or substantially eliminated) and there is merely a single undershoot transition which could lead to a guaranteed Vmin based on a comparator delay and the di/dt of the load with the available output decoupling capacitance.

In some embodiments, device 2400 comprises one or more clock generator circuitries, generally referred to as clock generator 2416. Clock generator 2416 generates clock signals at appropriate frequency levels, which may be supplied to any appropriate components of device 2400. Merely as an example, clock generator 2416 is illustrated to be supplying clock signals to processor 2404 of device 2400. In some embodiments, clock generator 2416 receives one or more Frequency Identification (FID) signals, and generates the clock signals at an appropriate frequency, based on the FID signals.

In some embodiments, device 2400 comprises battery 2418 supplying power to various components of device 2400. Merely as an example, battery 2418 is illustrated to be supplying power to processor 2404. Although not illustrated in the figures, device 2400 may comprise a charging circuitry, e.g., to recharge the battery, based on Alternating Current (AC) power supply received from an AC adapter.

In some embodiments, the charging circuitry (e.g., 2418) comprises a buck-boost converter. This buck-boost converter comprises DrMOS or DrGaN devices used in place of half-bridges for traditional buck-boost converters. Various embodiments here are described with reference to DrMOS. However, the embodiments are applicable to DrGaN. The DrMOS devices allow for better efficiency in power conversion due to reduced parasitic and optimized MOSFET packaging. Since the dead-time management is internal to the DrMOS, the dead-time management is more accurate than for traditional buck-boost converters leading to higher efficiency in conversion. Higher frequency of operation allows for smaller inductor size, which in turn reduces the z-height of the charger comprising the DrMOS based buck-boost converter. The buck-boost converter of various embodiments comprises dual-folded bootstrap for DrMOS devices. In some embodiments, in addition to the traditional bootstrap capacitors, folded bootstrap capacitors are added that cross-couple inductor nodes to the two sets of DrMOS switches.

In some embodiments, device 2400 comprises Power Control Unit (PCU) 2410 (also referred to as Power Management Unit (PMU), Power Controller, etc.). In an example, some sections of PCU 2410 may be implemented by one or more processing cores 2408, and these sections of PCU 2410 are symbolically illustrated using a dotted box and labelled PCU 2410*a*. In an example, some other sections of PCU 2410 may be implemented outside the processing cores 2408, and these sections of PCU 2410 are symbolically illustrated using a dotted box and labelled as PCU 2410*b*. PCU 2410 may implement various power management operations for device 2400. PCU 2410 may include hardware interfaces, hardware circuitries, connectors, registers, etc., as well as software components (e.g., drivers, protocol stacks), to implement various power management operations for device 2400.

In some embodiments, device 2400 comprises Power Management Integrated Circuit (PMIC) 2412, e.g., to implement various power management operations for device 2400. In some embodiments, PMIC 2412 is a Reconfigurable Power Management ICs (RPMICs) and/or an IMVP (Intel® Mobile Voltage Positioning). In an example, the PMIC is within an IC chip separate from processor 2404. The may implement various power management operations for device 2400. PMIC 2412 may include hardware interfaces, hardware circuitries, connectors, registers, etc., as well as software components (e.g., drivers, protocol stacks), to implement various power management operations for device 2400.

In an example, device 2400 comprises one or both PCU 2410 or PMIC 2412. In an example, any one of PCU 2410 or PMIC 2412 may be absent in device 2400, and hence, these components are illustrated using dotted lines.

Various power management operations of device 2400 may be performed by PCU 2410, by PMIC 2412, or by a combination of PCU 2410 and PMIC 2412. For example, PCU 2410 and/or PMIC 2412 may select a power state (e.g., P-state) for various components of device 2400. For example, PCU 2410 and/or PMIC 2412 may select a power state (e.g., in accordance with the ACPI (Advanced Configuration and Power Interface) specification) for various components of device 2400. Merely as an example, PCU 2410 and/or PMIC 2412 may cause various components of the device 2400 to transition to a sleep state, to an active state, to an appropriate C state (e.g., C0 state, or another appropriate C state, in accordance with the ACPI specification), etc. In an example, PCU 2410 and/or PMIC 2412 may control a voltage output by VR 2414 and/or a frequency of a clock signal output by the clock generator, e.g., by outputting the VID signal and/or the FID signal, respectively. In an example, PCU 2410 and/or PMIC 2412 may control battery power usage, charging of battery 2418, and features related to power saving operation.

The clock generator 2416 can comprise a phase locked loop (PLL), frequency locked loop (FLL), or any suitable clock source. In some embodiments, each core of processor 2404 has its own clock source. As such, each core can operate at a frequency independent of the frequency of operation of the other core. In some embodiments, the PLL includes a time-to-digital converter (TDC) which is a bipolar TDC. In some embodiments, the bipolar TDC comprises a phase detection and signal switching circuitry and a phase error measurement circuitry. The phase detection and signal switching circuitry include a multiplexer and phase detector, together referred to as PD_MUX. In some embodiments, the PD_MUX is used to handle the order of the two input signal phases of a TDC, or in other words, to enable bipolarity detection of the phase error. The TDC detects the polarity of the phase error and then prepares the right phase order when they arrive at the TDC measurement elements of the phase error measurement circuitry to ensure that always the earlier one starts the TDC and the later one triggers the measurement event. As such, the phase measurement circuitry (or measurement block) provides the phase error magnitude information, while the PD_MUX provides the sign—polarity information.

In some embodiments, the first PLL that receives a sine wave as reference clock is a reference sampling Type-I PLL. The Type-I PLL directly samples the reference clock (a sine or cosine wave) and therefore does not use the reference buffer. In some embodiments, the phase-detector of the Type-I PLL is a passive sampling switch which neither consumes any power nor generates any noise. In some embodiments, a double sampling phase-detector with a switched-capacitor passive voltage interpolator circuit is used by the Type-I PLL to achieve fractional-N output. Using passive devices reduces power consumption. The Type-I PLL provides a low complexity and low power design solution for the fractional-N clock generators. The reference sampling technique removes the reference clock buffer and the charge-pump which are the major contributors of noise and overall system power consumption. In addition, a fully passive switched-capacitor voltage interpolator is utilized for achieving fractional-N by the Type-I PLL. The technique of various embodiments is independent of circuit topology and therefore can be utilized in both LC (inductor-capacitor) and ring oscillator based PLL architecture.

In some embodiments, PCU 2410 and/or PMIC 2412 performs adaptive or dynamic frequency scaling or adjustment. For example, clock frequency of a processor core can be increased if the core is not operating at its maximum power consumption threshold or limit. In some embodiments, PCU 2410 and/or PMIC 2412 determines the operating condition of each core of a processor, and opportunistically adjusts frequency and/or power supply voltage of that core without the core clocking source (e.g., PLL of that core) losing lock when the PCU 2410 and/or PMIC 2412 determines that the core is operating below a target performance level. For example, if a core is drawing current from a power supply rail less than a total current allocated for that core or processor 2404, then PCU 2410 and/or PMIC 2412 can temporality increase the power draw for that core or processor 2404 (e.g., by increasing clock frequency and/or power supply voltage level) so that the core or processor 2404 can perform at higher performance level. As such, voltage and/or frequency can be increased temporality for processor 2404 without violating product reliability.

In an example, PCU 2410 and/or PMIC 2412 may perform power management operations, e.g., based at least in part on receiving measurements from power measurement circuitries 2442, temperature measurement circuitries 2440, charge level of battery 2418, and/or any other appropriate information that may be used for power management. To that end, PMIC 2412 is communicatively coupled to one or more sensors to sense/detect various values/variations in one or more factors having an effect on power/thermal behavior of the system/platform. Examples of the one or more factors include electrical current, voltage droop, temperature, operating frequency, operating voltage, power consumption, inter-core communication activity, etc. One or more of these sensors may be provided in physical proximity (and/or thermal contact/coupling) with one or more components or logic/IP blocks of a computing system. Additionally, sensor(s) may be directly coupled to PCU 2410 and/or PMIC 2412 in at least one embodiment to allow PCU 2410 and/or PMIC 2412 to manage processor core energy at least in part based on value(s) detected by one or more of the sensors.

Also illustrated is an example software stack of device 2400 (although not all elements of the software stack are illustrated). Merely as an example, processors 2404 may execute application programs 2450, Operating System 2452, one or more Power Management (PM) specific application programs (e.g., generically referred to as PM applications 2458), and/or the like. PM applications 2458 may also be executed by the PCU 2410 and/or PMIC 2412. OS 2452 may also include one or more PM applications 2456a, 2456b, 2456c. The OS 2452 may also include various drivers 2454a, 2454b, 2454c, etc., some of which may be specific for power management purposes. In some embodiments, device 2400 may further comprise a Basic Input/output System (BIOS) 2420. BIOS 2420 may communicate with OS 2452 (e.g., via one or more drivers 2454), communicate with processors 2404, etc.

For example, one or more of PM applications 2458, 2456, drivers 2454, BIOS 2420, etc. may be used to implement power management specific tasks, e.g., to control voltage and/or frequency of various components of device 2400, to control wake-up state, sleep state, and/or any other appropriate power state of various components of device 2400, control battery power usage, charging of the battery 2418, features related to power saving operation, etc.

In some embodiments, battery 2418 is a Li-metal battery with a pressure chamber to allow uniform pressure on a battery. The pressure chamber is supported by metal plates (such as pressure equalization plate) used to give uniform pressure to the battery. The pressure chamber may include pressured gas, elastic material, spring plate, etc. The outer skin of the pressure chamber is free to bow, restrained at its edges by (metal) skin, but still exerts a uniform pressure on the plate that is compressing the battery cell. The pressure chamber gives uniform pressure to battery, which is used to enable high-energy density battery with, for example, 20% more battery life.

In some embodiments, pCode executing on PCU 2410*a/b* has a capability to enable extra compute and telemetries resources for the runtime support of the pCode. Here pCode refers to a firmware executed by PCU 2410*a/b* to manage performance of the 2401. For example, pCode may set frequencies and appropriate voltages for the processor. Part of the pCode are accessible via OS 2452. In various embodiments, mechanisms and methods are provided that dynamically change an Energy Performance Preference (EPP) value based on workloads, user behavior, and/or system conditions. There may be a well-defined interface between OS 2452 and the pCode. The interface may allow or facilitate the software configuration of several parameters and/or may provide hints to the pCode. As an example, an EPP parameter may inform a pCode algorithm as to whether performance or battery life is more important.

This support may be done as well by the OS 2452 by including machine-learning support as part of OS 2452 and either tuning the EPP value that the OS hints to the hardware (e.g., various components of SoC 2401) by machine-learning prediction, or by delivering the machine-learning prediction to the pCode in a manner similar to that done by a Dynamic Tuning Technology (DTT) driver. In this model, OS 2452 may have visibility to the same set of telemetries as are available to a DTT. As a result of a DTT machine-learning hint setting, pCode may tune its internal algorithms to achieve optimal power and performance results following the machine-learning prediction of activation type. The pCode as example may increase the responsibility for the processor utilization change to enable fast response for user activity, or may increase the bias for energy saving either by reducing the responsibility for the processor utilization or by saving more power and increasing the performance lost by tuning the energy saving optimization. This approach may facilitate saving more battery life in case the types of activities enabled lose some performance level over what the system can enable. The pCode may include an algorithm for dynamic EPP that may take the two inputs, one from OS 2452 and the other from software such as DTT, and may selectively choose to provide higher performance and/or responsiveness. As part of this method, the pCode may enable in the DTT an option to tune its reaction for the DTT for different types of activity.

In some embodiments, VR 2414 includes a current sensor to sense and/or measure current through a high-side switch of VR 2414. In some embodiments the current sensor uses an amplifier with capacitively coupled inputs in feedback to sense the input offset of the amplifier, which can be compensated for during measurement. In some embodiments, the amplifier with capacitively coupled inputs in feedback is used to operate the amplifier in a region where the input common-mode specifications are relaxed, so that the feedback loop gain and/or bandwidth is higher. In some embodiments, the amplifier with capacitively coupled inputs in feedback is used to operate the sensor from the converter input voltage by employing high-PSRR (power supply rejection ratio) regulators to create a local, clean supply voltage, causing less disruption to the power grid in the switch area. In some embodiments, a variant of the design can be used to sample the difference between the input voltage and the controller supply, and recreate that between the drain voltages of the power and replica switches. This allows the sensor to not be exposed to the power supply voltage. In some embodiments, the amplifier with capacitively coupled inputs in feedback is used to compensate for power delivery network related (PDN-related) changes in the input voltage during current sensing.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process. The examples can be combined in any combinations. For example, example 4 can be combined with example 2.

Example 1: A phase locked loop comprising: a sampler circuitry to sample a reference clock by two phases of a divided clock to generate a first voltage and a second voltage; an interpolator to interpolate the first voltage or a sampled version of the first voltage with the second voltage or a sampled version of the second voltage to generate a third voltage; and an oscillator to receive the third voltage or a filtered version of the third voltage, wherein the third voltage is to control an oscillation frequency of the oscillator.

Example 2: The phase locked loop of claim 1, wherein the sampler circuitry is a first sampler circuitry, wherein the divided clock is a first divided clock, wherein the phase locked loop comprises a second sampler circuitry to sample the first voltage and the second voltage by a second divided clock to generate the sampled version of the first voltage and the sampled version of the second voltage.

Example 3: The phase locked loop of claim 2, wherein the second divided clock is delayed relative to the first divided clock.

Example 4: The phase locked loop of claim 1, wherein the interpolator comprises a first weight and a second weight, wherein the first weight and the second weight are adjusted after a cycle of the reference clock.

Example 5: The phase locked loop of claim 4, wherein the first weight corresponds to a first capacitance while the second weight corresponds to a second capacitance.

Example 6: The phase locked loop of claim 1, wherein the two phases have a phase difference of a period that corresponds to the oscillation frequency.

Example 7: The phase locked loop of claim 1, wherein the oscillator is voltage-controlled oscillator.

Example 8: The phase locked loop of claim 1, wherein the oscillator is an LC oscillator.

Example 9: The phase locked loop of claim 1, comprise a frequency locked loop to coarsely adjust the oscillation frequency of the oscillator near a target oscillation frequency, wherein the third voltage is to finely adjust the oscillation frequency of the oscillator near the target oscillation frequency.

Example 10: The phase locked loop of claim 1 comprises a capacitor coupled to an output of the interpolator to filter the third voltage.

Example 11: The phase locked loop of claim 10, wherein a capacitance of the capacitor is substantially 1 pico-Farad.

Example 12: The phase locked loop of claim 1, wherein the reference clock is a sine wave.

Example 13: An apparatus comprising: a sampler to sample a sinusoidal reference clock by two phases of a divided clock; an interpolator coupled to the sampler, the interpolator to interpolate the sampled sinusoidal reference clock which is sampled by the two phases of the divided clock; and an oscillator to generate an output clock according to the interpolated sampled sinusoidal reference clock.

Example 14: The apparatus of claim 13 comprises a capacitor coupled to an output of the interpolator and an input of the oscillator.

Example 15: The apparatus of claim 13, wherein the interpolator comprises a first weight and a second weight, wherein the first weight and the second weight are adjusted after a cycle of the sinusoidal reference clock.

Example 16: The apparatus of claim 15, wherein the first weight corresponds to a first capacitance while the second weight corresponds to a second capacitance.

Example 17: The apparatus of claim 13 comprises a frequency locked loop to coarsely adjust an oscillation frequency of the oscillator near a target oscillation frequency, wherein an output of the interpolator is to finely adjust the oscillation frequency of the oscillator near the target oscillation frequency.

Example 18: A system comprising: a memory; a processor coupled to the memory; and a wireless interface to allow the processor to communicate with another device, wherein the processor includes a type-I phase locked loop which comprises: a sampler circuitry to sample a reference clock by two phases of a divided clock to generate a first voltage and a second voltage; an interpolator to interpolate the first voltage or a sampled version of the first voltage with the second voltage or a sampled version of the second voltage to generate a third voltage; and an oscillator to receive the third voltage or a filtered version of the third voltage, wherein the third voltage is to control an oscillation frequency of the oscillator.

Example 19: The system of claim 18, wherein the sampler circuitry is a first sampler circuitry, wherein the divided clock is a first divided clock, wherein the phase locked loop comprises a second sampler circuitry to sample the first voltage and the second voltage by a second divided clock to generate the sampled version of the first voltage and the sampled version of the second voltage.

Example 20: The system of claim 19, wherein the second divided clock is delayed relative to the first divided clock, and wherein the interpolator comprises a first weight and a second weight, wherein the first weight and the second weight are adjusted after a cycle of the reference clock.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

What is claimed is:

1. A phase locked loop comprising:
   a sampler circuitry to sample a reference clock by two phases of a divided clock to generate a first voltage and a second voltage;
   an interpolator to interpolate the first voltage or a sampled version of the first voltage with the second voltage or a sampled version of the second voltage to generate a third voltage;
   an oscillator to receive the third voltage or a filtered version of the third voltage, wherein the third voltage is to control an oscillation frequency of the oscillator; and
   a fractional divider coupled between an output of the oscillator and an input of the sampler circuitry, the fractional divider to provide the divided clock to the sampler circuitry.

2. The phase locked loop of claim 1, wherein the sampler circuitry is a first sampler circuitry, wherein the divided clock is a first divided clock, wherein the phase locked loop comprises a second sampler circuitry to sample the first voltage and the second voltage by a second divided clock to generate the sampled version of the first voltage and the sampled version of the second voltage.

3. The phase locked loop of claim 2, wherein the second divided clock is delayed relative to the first divided clock.

4. The phase locked loop of claim 1, wherein the interpolator comprises a first weight and a second weight, wherein the first weight and the second weight are adjusted after a cycle of the reference clock.

5. The phase locked loop of claim 4, wherein the first weight corresponds to a first capacitance while the second weight corresponds to a second capacitance.

6. The phase locked loop of claim 1, wherein the two phases have a phase difference of a period that corresponds to the oscillation frequency.

7. The phase locked loop of claim 1, wherein the oscillator is voltage-controlled oscillator.

8. The phase locked loop of claim 1, wherein the oscillator is an LC oscillator.

9. The phase locked loop of claim 1, further comprising a frequency locked loop to coarsely adjust the oscillation frequency of the oscillator near a target oscillation frequency, wherein the third voltage is to finely adjust the oscillation frequency of the oscillator near the target oscillation frequency.

10. The phase locked loop of claim 1, further comprising a capacitor coupled to an output of the interpolator to filter the third voltage.

11. The phase locked loop of claim 10, wherein a capacitance of the capacitor is substantially 1 pico-Farad.

12. The phase locked loop of claim 1, wherein the reference clock is a sine wave.

13. An apparatus comprising:
a sampler to sample a sinusoidal reference clock by two phases of a divided clock to generate two sampled sinusoidal reference clocks;
an interpolator coupled to the sampler, the interpolator to interpolate the sampled sinusoidal reference clocks;
an oscillator to generate an output clock according to the interpolated sampled sinusoidal reference clocks; and
a fractional divider coupled between an output of the oscillator and an input of the sampler circuitry, the fractional divider to provide the divided clock to the sampler circuitry.

14. The apparatus of claim 13, further comprising a capacitor coupled to an output of the interpolator and an input of the oscillator.

15. The apparatus of claim 13, wherein the interpolator comprises a first weight and a second weight, wherein the first weight and the second weight are adjusted after a cycle of the sinusoidal reference clocks.

16. The apparatus of claim 15, wherein the first weight corresponds to a first capacitance while the second weight corresponds to a second capacitance.

17. The apparatus of claim 13, further comprising a frequency locked loop to coarsely adjust an oscillation frequency of the oscillator near a target oscillation frequency, wherein an output of the interpolator is to finely adjust the oscillation frequency of the oscillator near the target oscillation frequency.

18. A system comprising:
a memory;
a processor coupled to the memory; and
a wireless interface to allow the processor to communicate with another device, wherein the processor includes a type-I phase locked loop which comprises:
a sampler circuitry to sample a reference clock by two phases of a divided clock to generate a first voltage and a second voltage;
an interpolator to interpolate the first voltage or a sampled version of the first voltage with the second voltage or a sampled version of the second voltage to generate a third voltage;
an oscillator to receive the third voltage or a filtered version of the third voltage, wherein the third voltage is to control an oscillation frequency of the oscillator; and
a fractional divider coupled between an output of the oscillator and an input of the sampler circuitry, the fractional divider to provide the divided clock to the sampler circuitry.

19. The system of claim 18, wherein the sampler circuitry is a first sampler circuitry, wherein the divided clock is a first divided clock, wherein the phase locked loop comprises a second sampler circuitry to sample the first voltage and the second voltage by a second divided clock to generate the sampled version of the first voltage and the sampled version of the second voltage.

20. The system of claim 19, wherein the second divided clock is delayed relative to the first divided clock, and wherein the interpolator comprises a first weight and a second weight, wherein the first weight and the second weight are adjusted after a cycle of the reference clock.

* * * * *